United States Patent [19]

Tabatabaie-Alavi et al.

[11] 4,414,076

[45] Nov. 8, 1983

[54] LOW RESISTANCE OHMIC CONTACT

[75] Inventors: Kamal Tabatabaie-Alavi, Cambridge; Abu N. M. M. Choudhury, Belmont; Nancy J. (Slater) Gabriel, Cambridge; Clifton G. Fonstad, Arlington, all of Mass.

[73] Assignee: The United States of America as represented by the Secretary of the Navy, Washington, D.C.

[21] Appl. No.: 471,098

[22] Filed: Mar. 1, 1983

[51] Int. Cl.$^3$ .......................... C25D 5/02; C25D 5/10; C25D 5/18
[52] U.S. Cl. ......................................... 204/15; 204/40
[58] Field of Search .................................. 204/15, 40

[56] References Cited

U.S. PATENT DOCUMENTS 3,926,747  12/1975  Newby .................................. 204/15
4,109,297   8/1978  Lesh .................................... 204/15

Primary Examiner—T. M. Tufariello
Attorney, Agent, or Firm—Robert F. Beers; Arthur A. McGill; Prithvi C. Lall

[57] ABSTRACT

A method for obtaining a very low resistance ohmic contact on p-type Indium Phosphide (InP) by light-assisted plating of Au and Zn. The plating technique, which uses alternating positive and negative current pulses, has been used for producing patterned, small area contacts on device structures and is compatible with established n-type ohmic contacting procedures.

8 Claims, 3 Drawing Figures

LOW RESISTANCE OHMIC CONTACT

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

This invention is related to microelectronics and, more particularly, to a method of forming very low resistance ohmic contacts on p-type InP.

(2) Description of the Prior Art

Recently InP has attracted much attention because of its wide use in the fabrication of laser diodes and detectors operating in the 1.3–1.7 $\mu$m (1 $\mu$m = $10^{-6}$ meters) wavelength region. Specific contact resistances in the low $10^{-6}$ ohm-cm$^2$ have been reported by Kuphal (Solid Electron: Vol. 24, p. 69, 1981); and Morkoc et al, IEEE Trans. Electron devices ED-28-1(1981) which are incorporated herein by reference. However, much progress remains to be made in the case ohmic contact on p-type InP. Kuphal and Ericson et al have reported the lowest specific contact resistances, approximately $1.1 \times 10^{-4}$ ohm-cm$^2$ and $10^{-4}$ ohm-cm$^2$ on p-type InP formed by evaporation of Au-Zn and Au-Mg respectively. Due to the high vapor pressure of zinc (Zn) and magnesium (Mg) at the evaporation temperatures, it is very difficult to control the thickness of the evaporated zinc or magnesium, particularly in the 50-nm (1 nm = $10^{-9}$ meters) range required. It has been found that even when an Au-Zn or Au-Mg alloy is used, the Zn and Mg evaporate first. Sputtering of the alloys is an alternative, but it is not compatible with lift-off patterning technique due to the good step coverage achieved in sputtering. Added to this difficulty is the severe contamination of the vacuum system used by zinc evaporation or sputtering. Thus, it is essential to have an easy and well-controlled process to plate on p-type InP which leads to a relatively low resistance ohmic contact. Additional requirements on a desirable process are that (1) small geometry contacts can be made easily through conventional photoresist masking techniques on the p-type areas of the sample and (2) these contacts can be sintered simultaneously with Ni/Ge/Au contacts formed on the n-type areas of the sample.

SUMMARY OF THE INVENTION

The method for fabrication very low resistance ohmic contacts on p-type InP according to the teachings of subject invention includes plating of Au and Zn assisted by light. The plating technique also uses alternating positive and negative current pulses and is compatible with the established n-type ohmic contacting procedures.

An object of subject invention is to fabricate low specific contact resistance (less than $10^{-4}$ ohm-cm$^2$) ohmic contacts on p-type InP.

Another object of subject invention is to have a process of fabricating small resistance contacts on p-type InP which have small geometry contacts.

Still another object of subject invention is to fabricate very small resistances ohmic contacts through conventional photoresist masking techniques on the p-type areas of the sample.

Still another object of subject invention is to fabricate very small resistance ohmic contacts which can be sintered simultaneously with the Ni/Ge/Au contacts formed on the n-type areas of the sample.

Still another object of subject invention is to fabricate very small resistance ohmic contacts on p-type InP using light assisted plating of Au and Zn.

Other objects, advantages and novel features of the invention will become apparent from the following detailed description of the invention when considered in conjunction with the following drawings:

DESCRIPTION OF A PREFERRED EMBODIMENT

A process for fabrication of very low resistance ohmic contacts on p-type InP according to the teachings of subject invention preferably used all samples cut from Zn doped liquid enscapsulated Czochralski (LEC) grown InP substrates, preferably 250 $\mu$m (1 $\mu$m = $10^{-6}$ meters) thick, with a net acceptor concentration $N_A - N_D$, for $7-8 \times 10^{17}$ cm$^{-3}$. It should further be noted that preferably a series of control samples were first used to determine the plating rate of Au and Zn. In order to form the ohmic contact, a desired pattern was formed using a 1.4-$\mu$m thick layer of Shipley AZ1350J photoresist and conventional photolithographic techniques which are already well known in the art. In the measurements of specific contact resistance reported below, a repeated pattern of four dots with diameters of 57-, 81-, 115- and 165 $\mu$m was used.

It should further be noted that the interface between the electrolyte and the semiconductor forms a schottky barrier which is forward biased in the case of plating on n-type InP but is reverse biased in the case of p-type InP. Since the reverse biased diode blocks the current, direct plating on p-type InP cannot normally be achieved. This difficulty was overcome by generating hole-electron pairs at the surface using a 200 watt white light projector lamp driven at 70-V rms and illuminating the sample from a distance of preferably 20 cm.

Figure 1:
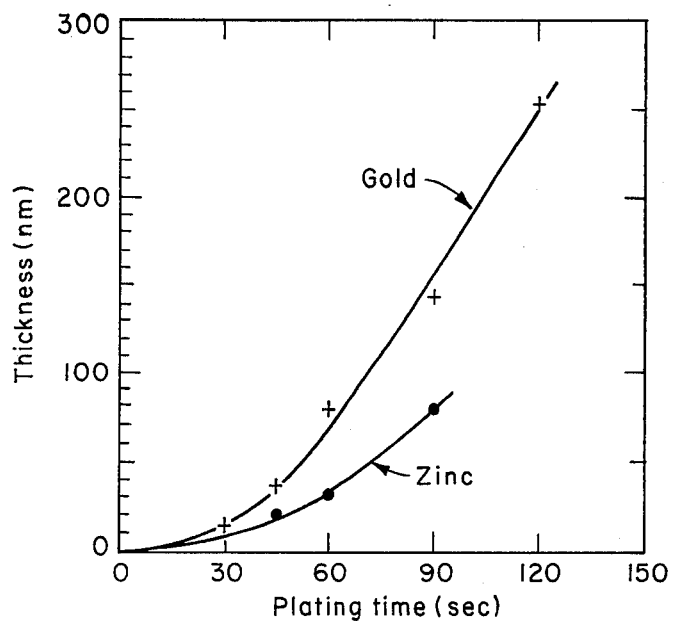
FIG. 1 a graphical representation of thickness of Au or Zn deposited on the sample as a function of plating time.

Gold plating was accomplished at 65° C. using positive and negative current pulses, 40-ms (millisecond) period, with current densities of +7.5 mA/cm$^2$ (1 mA = $10^{-3}$ amperes) −1.5 mA/cm$^2$ in the positive and negative half-cycles respectively. Zinc plating was accomplished at 55° C. with current densities of +10 mA/cm$^2$ and −2 mA/cm$^2$ respectively. However, prior to zinc plating a thin layer of gold (15 nm thick) is plated for 30 seconds on the surface. This significantly improved the adhesion and overall quality of zinc film and contacts. The film thickness was plotted as a function of plating time as shown in FIG. 1. The thickness of gold (15 nm) was substracted from the total measured thickness after zinc plating. As can be seen from FIG. 1, the plating rate of gold, for example, is slow and nonlinear in the first 30 seconds. During this time a thin layer (approximately 15 nm) is plated. Once a 20–30 nm-thick layer is formed, the plating rate increased rapidly and remained nearly constant as is seen from the fairly linear dependence of thickness on time. It should be further noted that a patterned sample must be illuminated during the whole plating period although the light will be all reflected from or absorbed in the gold plated areas, at least when they are thicker than 100 nm which indicated that there must be electron-hole pair generation at the surface in masked, unplated areas which create a very thin conductive layer at the surface through which the plating current is conducted.

Figure 2:
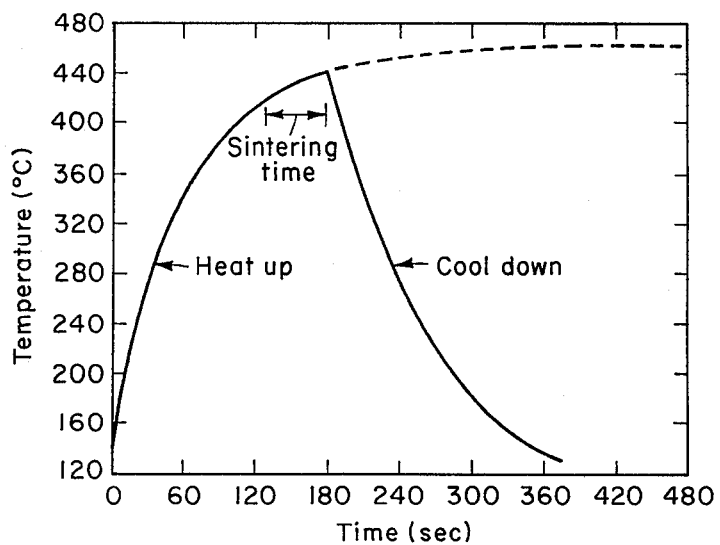
FIG. 2 is a graphical representation of the temperature cycle for sintering process wherein sintering time is taken to be the time from which the sample first reaches 420° C. until the onset of cooling down.

The ohmic contacts were formed by first plating a thin layer (15 nm) of gold, followed by a thicker layer of zinc and still more gold. The total thickness of the plated Au/Zn/Au metalization was 200 nm with 10 wt.% zinc, which corresponded to the stoichiometric composition $Au_3Zn$ which forms at approximately 420° C. When the plating is completed, the photoresist was removed with acetone, after which the samples were rinsed in methanol and blown dry with nitrogen. To produce test structures, Au/Zn/Au was also plated over the entire back surface of the p-type InP sample using the procedures used above. The samples were sintered in the forming gas (a mixture of argon and hydrogen) atmosphere for different periods of time ranging from 30 to 75 seconds. The heat cycle during the sintering is shown in FIG. 2 where sintering time is defined as the time from when the sample temperature first reaches 420° C. until the start of the cool down cycle.

The extremely smooth and excellent surface morphology of the plated films was obtained. It was found that surface morphology remained good after sintering. This produced very small geometry ohmic contacts on p-type InP. Adhesion to the surface was good and contacts were mechanically rugged.

Figure 3:
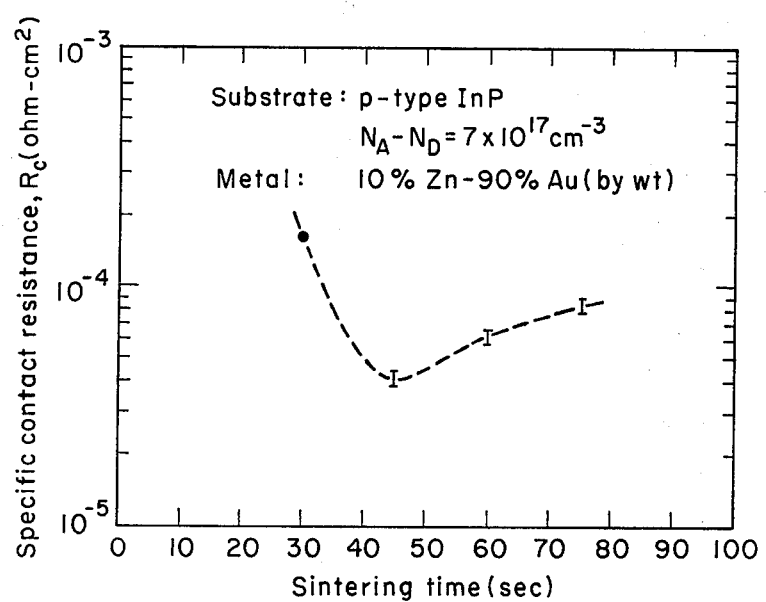
FIG. 3 is a graphical representation of specific contact resistance of plated Au/Zn/Au contacts on p-InP as a function of the sintering time.

The I-V (current-voltage) characteristics of the contacts were extremely linear and no change in the contact resistance was observed even at high current densities (400 A/cm$^2$). The variation of the specific contact resistance with the sintering time is shown in FIG. 3. The contacts sintered for only 30 seconds had relatively high contact resistances ($1.6 \times 10^{-4}$ ohm-cm$^2$) but exhibit the expected linear dependence of contact resistance on the inverse square of the diameter after subtracting the substrate contribution. It should be noted that when the contacts were sintered more than 40 seconds, the specific contact resistance reduced to the mid-to-lot $10^{-5}$ ohm-cm$^2$ range, so low that the substrate contribution to the measured resistance was the dominating factor especially for the larger area contacts. The ranges of value indicated for the three lowest resistance points were obtained by assuming either no back contact resistance contribution (upper limit) or a back contact resistance contribution to the total contact resistance in proportion to the contribution found in the analysis of the higher resistance contacts (lower limit). The values obtained, i.e., approximately $4 \times 10^{-5}$ ohm-cm$^2$, for a 45 second sintering time, were the lowest values obtained so far. It should further be noted that the above-described procedure was also used to form low resistance contacts to isolated p regions implanted in a n-InGaAs epilayer on a n-InP wafer, which demonstrated that the procedure was useful not only on uniformly p-type material but on patterned device structures as well. And it was also found that the annealing times and temperatures were the same as could be used to produce low resistance NI/Ge//Au n-type contacts. This procedure has been used for fabricating low resistance, small area ohmic contacts on p-InP and the technique is suitable for contacting patterned device structures and is compatible with n-type contacting procedures.

Briefly stated, the fabrication technique for producing very low resistance ohmic contacts on p-type InP according to the teachings of subject invention includes light assisted plating of gold, zinc and then gold on a p-type substrate for p-type InP.

Many modifications and variations of the present invention are possible in the light of the above teachings. As an example, substrates of p-type InP can be of varying thickness other than the thickness quoted in the preferred embodiment. Furthermore, the magnitude of the negative and positive pulses used for electroplating can also vary without deviating from the teachings of subject invention. It is therefore, to be understood that within the scope of the appended claims the invention may be practiced otherwise than as specifically described.

We claim:

1. A method of fabricating low resistance ohmic contact on a p-type InP substrate using photoresist which comprises the steps of:
   plating a first film of gold on said substrate;
   plating a zinc film on said first layer of gold; and
   plating a second film of gold on said layer of zinc.

2. The method of claim 1 which further includes the step of generating hold-electron pairs by lighting said substrate with a light source during plating of said substrate.

3. The method of claim 2 wherein the step of plating of said first film of gold includes using positive and negative current pulses to improve adhesion thereof.

4. The method of claim 3 wherein the step of plating of said zinc film includes using positive and negative current pulses to improve adhesion thereof.

5. The method of claim 4 wherein the step of plating of said second film of gold includes using positive and negative current pulses to improve adhesion thereof.

6. The method of claim 5 wherein the step of plating said first film of gold includes depositing 15 nm of gold on said substrate.

7. The method of claim 6 which further includes the step of removing the photoresist from said substrate.

8. The method of claim 7 which further includes the step of sintering said substrate after plating said first film of gold, said zinc film and said second gold film.

* * * * *